(12) United States Patent
Hollis et al.

(10) Patent No.: US 8,729,894 B2
(45) Date of Patent: May 20, 2014

(54) SYSTEM AND METHOD FOR OPERATING A MAGNETIC RESONANCE IMAGING SYSTEM DURING RAMPING

(75) Inventors: Timothy James Hollis, Oxford (GB); Yuri Lvovsky, Florence, SC (US)

(73) Assignee: General Electric Company, Schenectady, NY (US)

( * ) Notice: Subject to any disclaimer, the term of this patent is extended or adjusted under 35 U.S.C. 154(b) by 518 days.

(21) Appl. No.: 12/847,846

(22) Filed: Jul. 30, 2010

(65) Prior Publication Data

US 2012/0028805 A1   Feb. 2, 2012

(51) Int. Cl.
*G01V 3/00* (2006.01)

(52) U.S. Cl.
USPC .......................................... 324/307

(58) Field of Classification Search
USPC ................ 324/300–322; 335/296–306
See application file for complete search history.

(56) References Cited

U.S. PATENT DOCUMENTS

| | | | |
|---|---|---|---|
| 4,924,198 A * | 5/1990 | Laskaris | 505/211 |
| 5,220,800 A | 6/1993 | Müller et al. | |
| 5,721,522 A | 2/1998 | Roth et al. | |
| 5,731,939 A * | 3/1998 | Gross et al. | 361/19 |
| 5,739,689 A | 4/1998 | Roth et al. | |
| 5,828,280 A | 10/1998 | Spivey, Jr. et al. | |
| 5,861,788 A * | 1/1999 | Ohkura et al. | 335/216 |
| 5,936,499 A | 8/1999 | Eckels | |
| 6,097,187 A * | 8/2000 | Srivastava et al. | 324/320 |
| 6,144,274 A * | 11/2000 | Bischke et al. | 335/216 |
| 7,298,602 B2 * | 11/2007 | Knight | 361/141 |
| 7,372,273 B2 * | 5/2008 | Huang et al. | 324/318 |
| 7,522,027 B2 * | 4/2009 | Calvert et al. | 335/299 |
| 7,665,312 B2 * | 2/2010 | Jonas et al. | 62/51.1 |
| 7,832,216 B2 * | 11/2010 | Astra | 62/51.1 |
| 8,027,139 B2 * | 9/2011 | Beier | 361/141 |
| 8,305,726 B2 * | 11/2012 | Blakes et al. | 361/141 |
| 8,316,707 B2 * | 11/2012 | Edgley et al. | 73/304 R |
| 8,482,369 B2 * | 7/2013 | Wang et al. | 335/216 |
| 8,525,023 B2 * | 9/2013 | Tigwell et al. | 174/15.5 |
| 2005/0111159 A1 | 5/2005 | Knight | |
| 2009/0275478 A1 * | 11/2009 | Atkins et al. | 505/163 |
| 2009/0277517 A1 | 11/2009 | Mann | |

FOREIGN PATENT DOCUMENTS

| | | |
|---|---|---|
| EP | 2295998 A | 3/2011 |
| EP | 2348267 A | 7/2011 |
| JP | 2003069092 A | 3/2003 |

OTHER PUBLICATIONS

Search Report from corresponding GB1111370.1, Oct. 18, 2011.

\* cited by examiner

*Primary Examiner* — Dixomara Vargas (74) *Attorney, Agent, or Firm* — The Small Patent Law Group; Dean D. Small (57) ABSTRACT

Systems and methods for operating a magnetic resonance imaging (MRI) during ramping are provided. One method includes reducing pressure in a cryogen vessel of an MRI system during magnet ramping. The method also includes returning pressure in the cryogen vessel to a normal operating pressure level after magnet ramping is complete.

21 Claims, 8 Drawing Sheets

SYSTEM AND METHOD FOR OPERATING A MAGNETIC RESONANCE IMAGING SYSTEM DURING RAMPING

BACKGROUND OF THE INVENTION

The subject matter disclosed herein relates generally to magnetic resonance imaging (MRI) systems, and more particularly to ramping MRI systems.

In conventional MRI systems having superconducting magnets, the windings of superconducting wire forming the superconducting magnets are cryogenically cooled using a helium vessel to maintain the magnets below a critical temperature. For example, the windings of the superconducting magnet are immersed in a bath or vessel of liquid helium to maintain a temperature below the critical temperature for superconducting operation.

When the MRI system is energized, and in particular when the superconducting magnet is energized, commonly referred to as ramping, the Lorentz force on the conductors increases, causing small movements of the wire that can lead to localized frictional heating. The generated heat can overheat a localized area of the coil and create a normal zone, where the conductors (or wires) of the windings lose superconducting property and transfer to a normal resistive state. The normal zone will spread through the winding due to the Joule heat and the thermal conduction, which results in a quench event. The quench is accompanied by the rapid boil-off of helium escaping from the cryogen bath in which the magnet windings are immersed.

Each quench, followed by the re-fill and re-ramp of the magnet, is an expensive and time consuming event. The conductors of the superconducting magnet are specified to provide enough stability margin to avoid normal zone propagation from the point of localized heating. The stability margin for the windings during ramping can be increased, for example, by increasing the critical current of the wires forming the windings, adding high conductivity stabilizer material or improving the cooling of the wires. However, these methods add cost and complexity to the MRI system.

BRIEF DESCRIPTION OF THE INVENTION

In accordance with various embodiments, a method for controlling a magnetic resonance imaging (MRI) magnet system is provided. The method includes reducing pressure in a cryogen vessel of an MRI system during magnet ramping and returning pressure in the cryogen vessel to a normal operating pressure level after magnet ramping is complete.

In accordance with other embodiments, a magnetic resonance imaging (MRI) magnet system is provided that includes a vessel having liquid cryogen therein and a superconducting magnet within the vessel. The vessel is configured to removably connect to a vacuum pump that is configured to pump cryogen from the vessel to reduce a pressure level within the vessel during ramping of the superconducting magnet and return the pressure level to a normal operating pressure level during normal magnet operation.

In accordance with yet other embodiments, a kit for ramping a magnetic resonance imaging (MRI) magnet system is provided. The kit includes a vacuum pump and a connector configured to connect the vacuum pump to a vessel of the MRI magnet system to pump cryogen from the vessel to reduce a pressure level within the vessel during ramping of a superconducting magnet of the MRI magnet system and return the pressure level to a normal level thereafter.

DETAILED DESCRIPTION OF THE INVENTION

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for ramping up a magnetic resonance imaging (MRI) system, for example, energizing the coils or windings of superconducting magnet of the MRI system during start up. A superconducting magnet system is pumped under vacuum to reduce the pressure of the cryogen vessel in which the windings of the superconducting magnet are located. By practicing at least one embodiment, and a technical effect of at least some embodiments is that the temperature of the cryogen (e.g., helium) within the vessel is decreased, thereby increasing the stability of the superconducting magnet during ramping, for example, to tolerate frictional disturbances and reduce the likelihood of quenching. Additionally, by practicing at least one embodiment, efforts to increase the stability of the conductor such as additional copper stabilizer, higher critical current or the impregnation of the coils or windings of the superconducting magnet may be eliminated.

Figure 1:
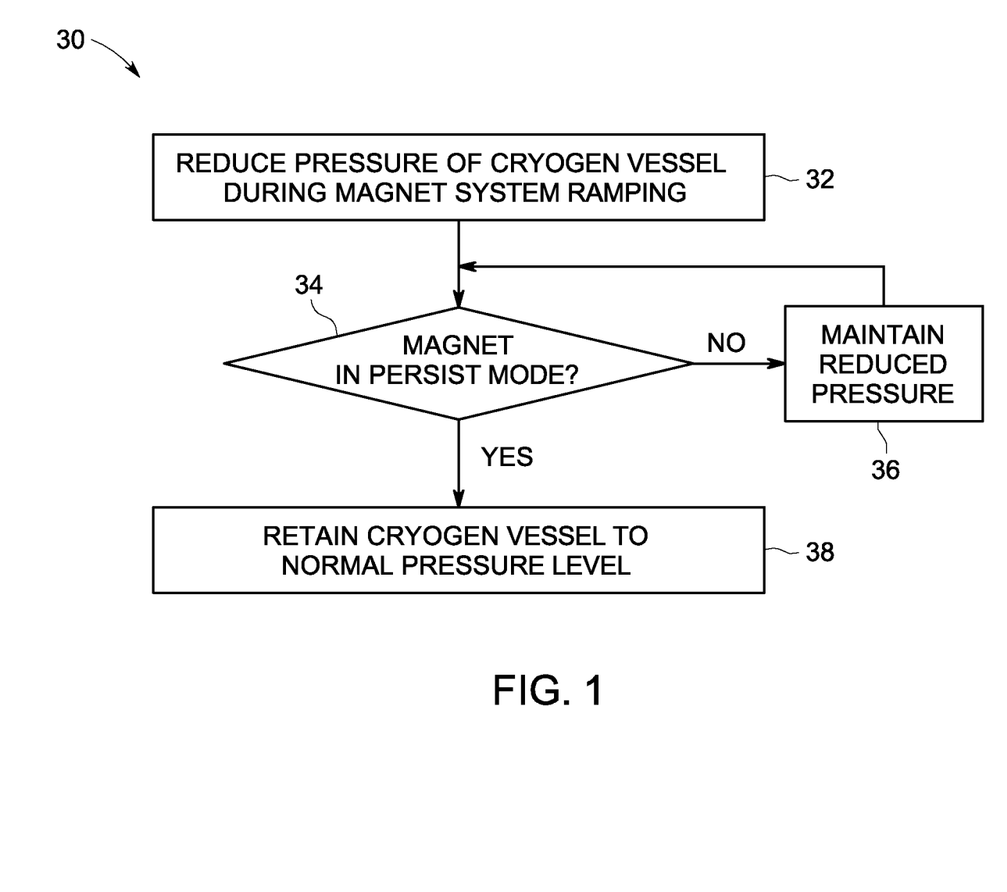
FIG. 1 is a flowchart of a method for ramping a magnetic resonance imaging (MRI) magnet system in accordance with various embodiments.

A method 30 for ramping an MRI system, and in particular, an MRI magnet system is illustrated in FIG. 1. In particular, the method 30 includes reducing the pressure of the cryogen vessel during ramping of the magnet system of the MRI system at 32. As used herein, ramping generally refers to the start up of the MRI system including energizing the coils or windings of the superconducting magnet. It should be noted that the reduction of pressure may be initiated prior to ramping, such as by performing a pre-ramping pump-down of the cryogen to reduce the pressure in the cryogen vessel as described in more detail below, which results in a corresponding reduction in temperature. For example, in one embodiment where the cryogen is helium, helium gas is pumped out of the cryogen vessel prior and/or during ramping. As described in more detail herein, different pumping configurations and arrangements for cryogen vessels may be provided, such as (i) a thermally connected pump-down chamber, (ii) a hydraulically connected displacing chamber or (iii) a chamber with a cryogenic pump. It should be noted that these configurations and arrangements are merely exemplary and any suitable method or system may be used that allows a reduction in pressure in the cryogen vessel.

In some embodiments, helium in a helium vessel is pumped-down to a superfluid temperature, for example, about 1.8 Kelvin (K), wherein the liquid helium is below a lambda ($\lambda$) point of liquid helium in a state referred to as helium II. However, the helium vessel may be pumped-down to different temperatures that are higher or lower than the superfluid temperature. The vessel is maintained at this lower pumped-down pressure level until after ramping is complete, for example, when the magnet system enters a normal or persistent mode of operation.

Figure 2:
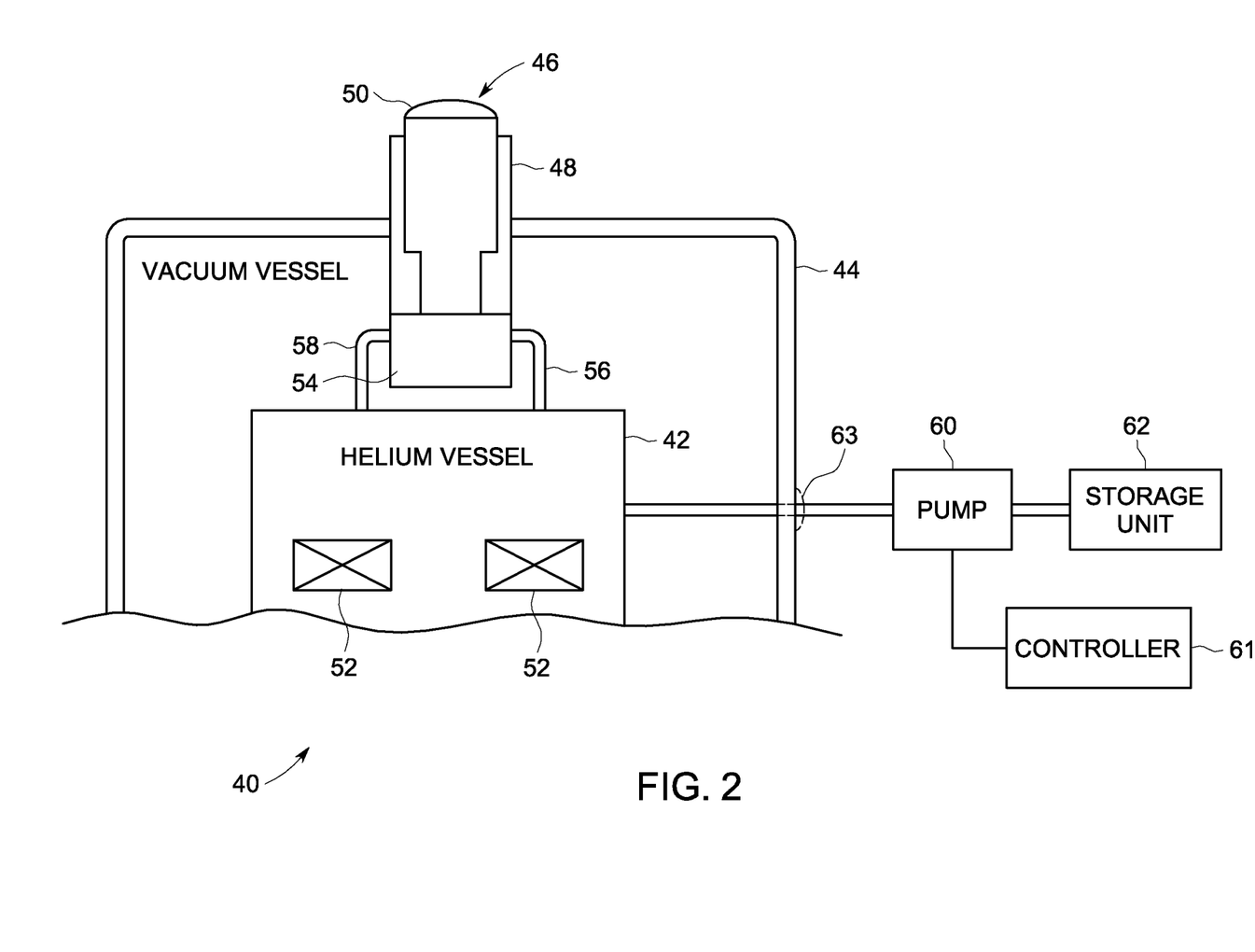
FIG. 2 is diagram illustrating an MRI magnet system in connection with which various embodiments may be implemented.

The reduction of pressure of the cryogen vessel may be performed in connection with an MRI magnet system 40 illustrated generally in FIG. 2, showing a portion of an MRI system. The MRI magnet system 40 includes the vessel 42 that holds a liquid cryogen, such as liquid helium. Thus, in this embodiment, the vessel 42 is a helium vessel, which also may be referred to as a helium pressure vessel. The vessel 42 is surrounded by a vacuum vessel 44 and may optionally include a thermal shield (not shown) therein and/or therebetween, which thermal shield may be, for example, a thermally isolating radiation shield. A coldhead 46, which in various embodiments is a cryocooler, extends through the vacuum vessel 44 within a coldhead sleeve 48 (e.g., a housing). Thus, the cold end of the coldhead 46 may be positioned within the coldhead sleeve 48 without affecting the vacuum within the vacuum vessel 44. The coldhead 46 is inserted and secured within the coldhead sleeve 48 using any suitable means, such as one or more flanges and bolts, or other means known in the art. Moreover, a motor 50 of the coldhead 46 is provided outside the vacuum vessel 44.

One or more magnet coils 52, which in various embodiments are superconducting coils, are provided inside the helium vessel 42 and are controlled during operation of the MRI system as described in more detail herein to acquire MRI image data. Additionally, during operation of the MRI system, liquid helium within the helium vessel 42 of the MRI magnet system 40 cools the superconducting magnet coils 52, which may be configured as a coil assembly as is known. The superconducting magnet coils 52 are cooled during normal operation (or in a persistent state) to a superconducting temperature (e.g., 4.2 K) and to a lower temperature, for example, a superfluid temperature during ramping of the magnet system 40 as described in more detail herein.

During system operation, the cooling process may include the recondensing of boiled off helium gas to liquid by a helium recondensing system 54 and returned to the helium vessel 42. It should be noted that the boiled off helium may pass through a gas passageway 56 that connects the helium vessel 42 to a recondensing system 54 and the recondensed helium may be returned to the helium vessel through a passageway 58.

Because the magnet does not require a lower pressure level during normal operation, a determination is made at 34 as to whether magnet ramping is complete, namely that the magnet system is no longer in the ramping mode of operation. For example, a determination may be made as to whether the magnet system is in a normal or persistent mode of operation. This determination may be made based on whether energizing current is being applied to the superconducting magnet.

If a determination is made at 34 that the magnet system is still in the ramping mode of operation, the reduced pressure level is maintained at 36. For example, the pressure of the cryogen vessel is maintained such that the helium is in a helium II state at a superfluid temperature. If a determination is made at 34 that the magnet system is no longer or not in the ramping mode of operation, then at 38 the cryogen vessel is returned to a normal pressure. The pressure may be increased by returning or adding liquid cryogen to the cryogen vessel. In some embodiments, after the ramping mode of operation, the magnet system is put into a normal or persistent mode of operation by returning the pressure in the cryogen vessel to ambient pressure or near ambient pressure (e.g., 4 psi over ambient), which results in a normal operating temperature of about 4.5 K (e.g., 4.2 K).

Accordingly, in various embodiments, reduced cryogen vessel pressure is provided only during ramping. While the coldhead provides zero boil-off recondensing during the normal operation, the coldhead has limited capacity that substantially decreases at lower temperatures (pressures). The capacity of the coldhead would be insufficient to maintain a low pressure regime with constant cryogen level continuously during regular MRI scanner operations. It should be noted that the reduced pressure may also be provided prior to ramping such that at the start of ramping the pressure in the cryogen vessel is reduced to provide, for example, superfluid temperature of the liquid cryogen.

Figure 3:
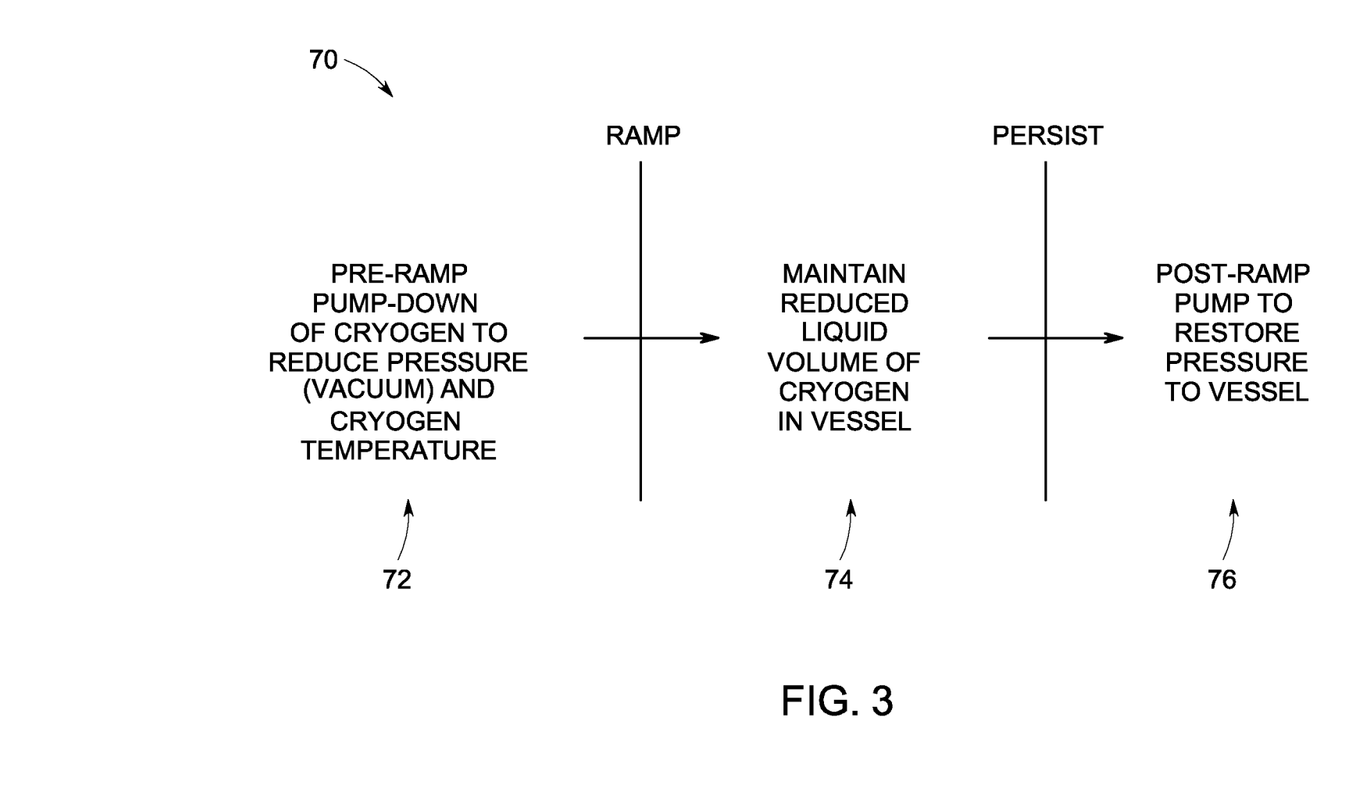
FIG. 3 is a diagram illustrating a timeline of a magnet energization process in accordance with various embodiments.

As illustrated in the timeline 70 of FIG. 3, showing one embodiment of a magnet energization process, a pre-ramp pump-down of the cryogen is performed at 72, which in this embodiment is illustrated as occurring prior to the ramping mode of operation. The pre-pumping, which may include a vacuum process, reduces the pressure, resulting in a decrease in the temperature of the cryogen. The pre-pumping may reduce the cryogen to a superfluid temperature prior to initiating a system ramping procedure. The pre-pumping may reduce the cryogen pressure such that other lower temperatures are provided, such as 3 K, 2.5 K, etc.

Thereafter, the vessel pressure is maintained at the lower level during some or all of the ramping mode of operation, which maintains the temperature at the lower level. At the end of the ramping mode of operation, such as after the magnet system has entered a normal or persist (persistent) mode of operation, post-ramp pumping (or other methods, such as vessel filling methods) are performed to restore the pressure (and accordingly the temperature) of the cryogen to a normal operating pressure and temperature as described in more detail herein. It should be noted that the cryogen vessel pressure may be returned to the normal operating pressure and/or the process to return the cryogen vessel pressure to the normal operating pressure may be initiated prior to the end of ramping (e.g., a predetermined time period before the end of ramping), at the end of ramping or after the end of ramping (e.g., a predetermined time period after ramping).

In one embodiment, and as illustrated in FIG. 2, a pump 60 (e.g., vacuum pump) is connected to the helium vessel 42 to allow helium gas to be pumped directly out of the helium vessel 42. The pump 60 may be any suitable pump and the connection means for connection to the helium vessel 42 is generally any passageway that allows for the transfer of the helium (or cryogen) in either gas or liquid form. Thus, as helium is pumped out from the helium vessel 42, the liquid level of helium in the helium vessel 42 is reduced, thereby reducing the pressure in the helium vessel and, accordingly, the temperature. It should be noted that the amount of liquid pumped from the helium vessel 42 may be a predetermined amount (e.g., based on the size of the vessel and a desired or required pressure reduction) or based on a current temperature of the cryogen, such as, a currently lowered temperature of the helium in the helium vessel 42 as measured by a temperature sensing device (not shown).

The pump 60 is connected to a storage unit 62, which may be any type of container capable of storing the liquid helium pumped from the helium vessel 42. In some embodiments, the liquid helium pumped from the helium vessel 42 may be temporarily stored in the storage unit 62 and then re-used (e.g., released or pumped back into the helium vessel 42) to restore the helium vessel 42 to a normal operating pressure (e.g., about ambient pressure) after ramping. It should be noted that if the level drop of the helium in the helium vessel 42 after pumping is not at a desired or required level, the pressure in the helium vessel 42 may be restored to a normal operating pressure, leaving sub-cooled helium, to which may be added helium (at about 4.2 K) before pumping again. This process of re-pumping may be performed iteratively.

A controller 61 is connected to the pump 60 to control the operation of the pumping, for example, to control the level of pressure within the helium vessel 42 during ramping as described in more detail herein. For example, the controller 61 may be connected to a temperature sensing device (not shown) or pressure sensing device (not shown) that measure the temperature of and pressure in the helium vessel 42, respectively. Thus, the controller 61 may control the pump 60 such that reduced pressure in the helium vessel is provided during ramping. The controller 61 may be configured to perform one or more of the processes or methods described herein, such as the method 30.

The controller 61 may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as a floppy disk drive, optical disk drive, and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments. The set of instructions may be in the form of a software program. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

Referring again to FIG. 2, it should be noted that the pump 60 (and other embodiments of pumps described herein) may be a vacuum pump, such as a portable vacuum pump. The vacuum pump and a pressure control unit may be used on site when the magnet is being ramped, for example, provided as a kit for connection to the MRI magnet system 40, which may include a connector 63 that forms part of the pump 60, the vessel 42, the vacuum vessel 44, any combination of the pump 60, the vessel 42 and the vacuum vessel 44 (such as a complementary connection arrangement, which may include a connecting line), or may be provided as a separate component.

Figure 4:
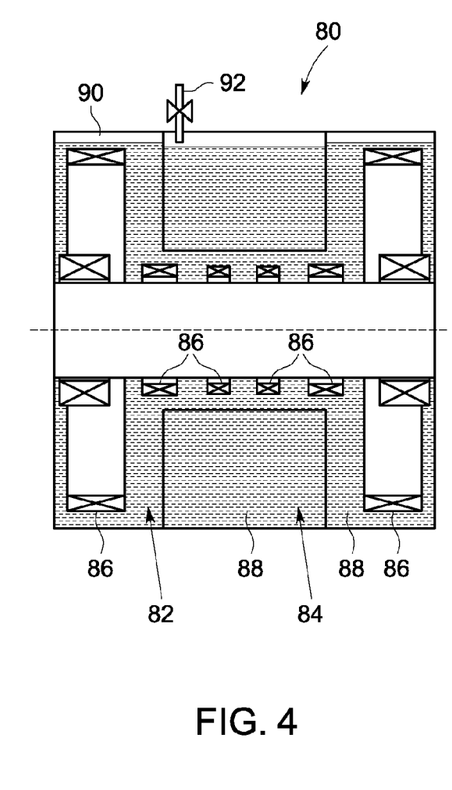
FIGS. 4-6 are diagrams illustrating an embodiment of a multi-chamber system for a cryogen vessel formed in accordance with various embodiments.
Figure 5:
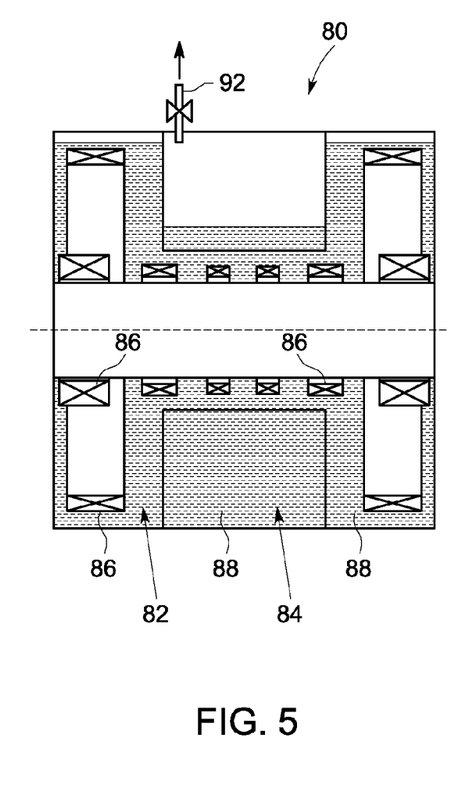
Figure 6:
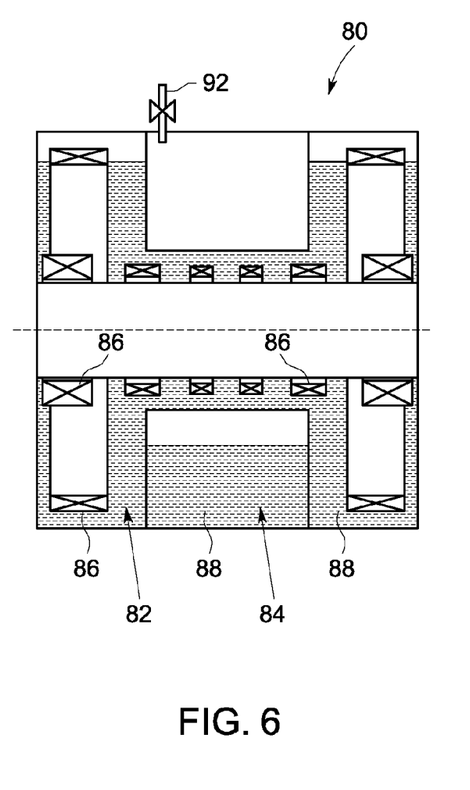
Figure 7:
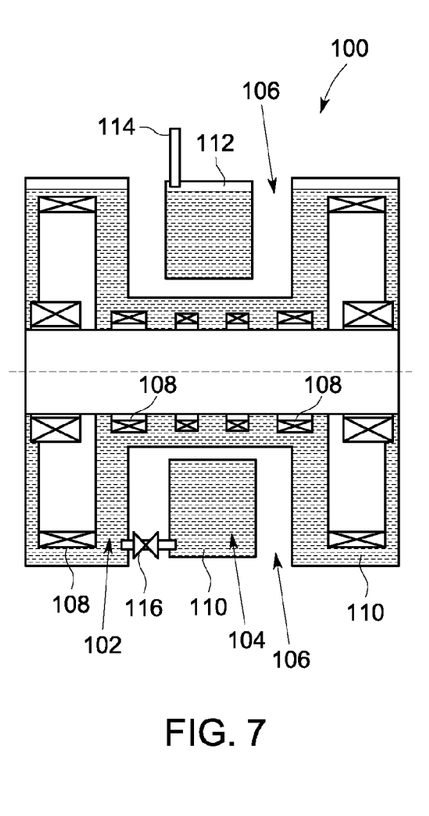
FIGS. 7-9 are diagrams illustrating another embodiment of a multi-chamber system for a cryogen vessel formed in accordance with various embodiments.
Figure 8:
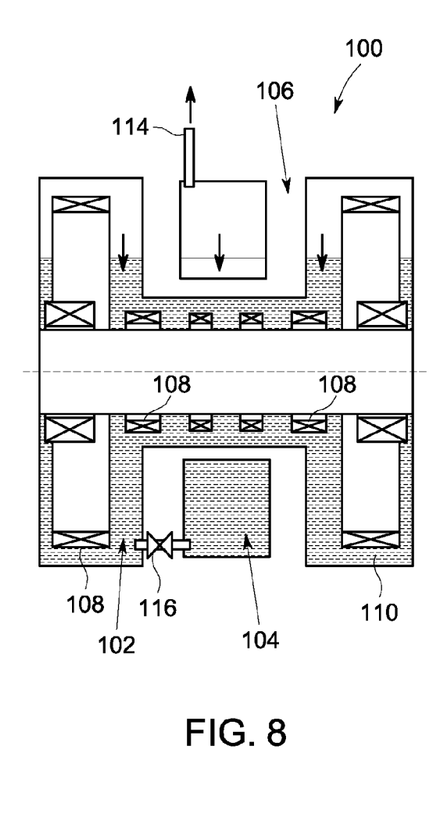
Figure 9:
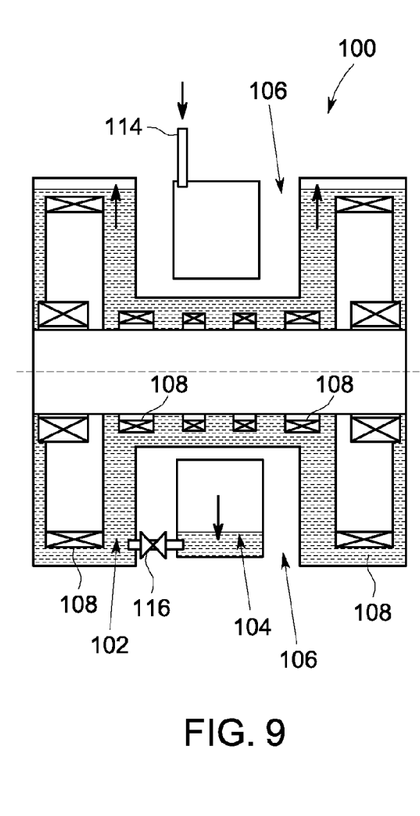
Figure 10:
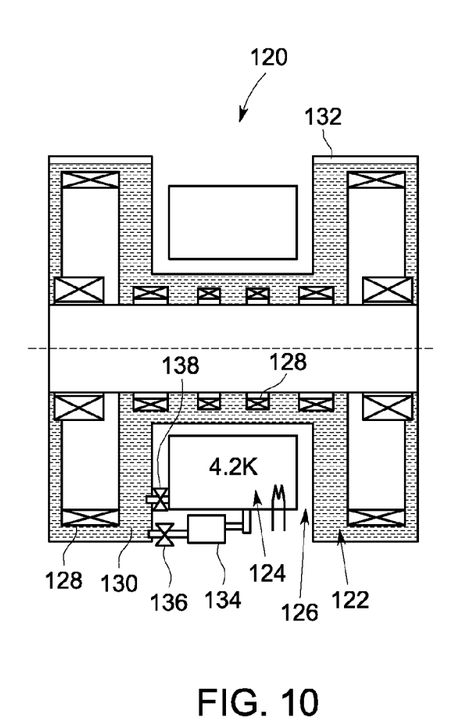
FIGS. 10-12 are diagrams illustrating an embodiment of a multi-chamber system for a cryogen vessel formed in accordance with various embodiments.
Figure 11:
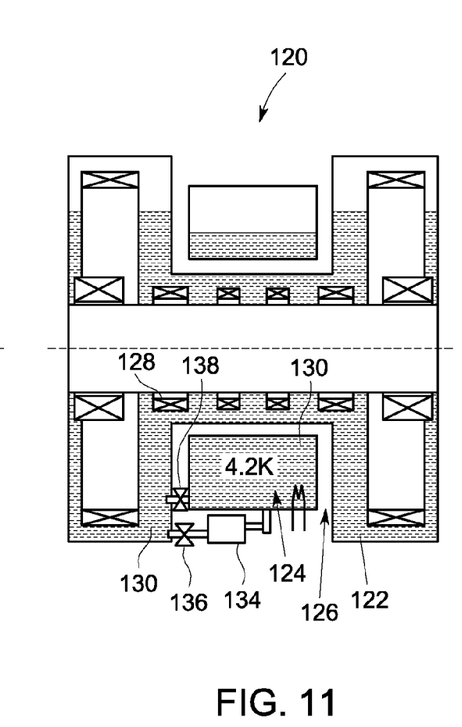
Figure 12:
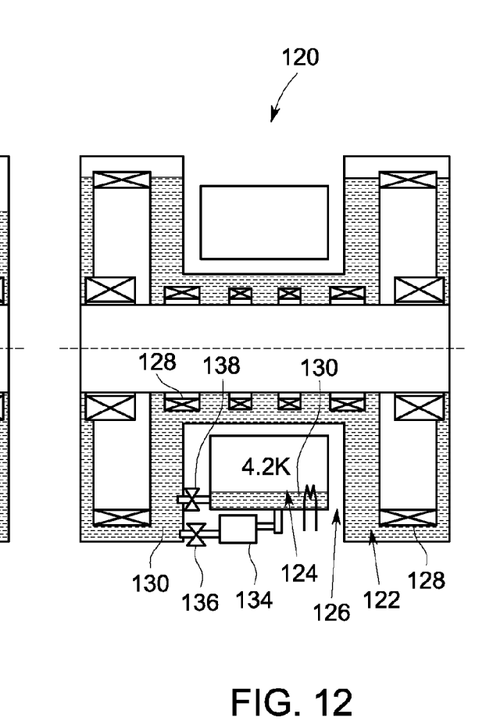

Other embodiments are also contemplated. For example, in accordance with some embodiments, a multi-chamber (e.g., two chamber) system is provided. The multi-chamber systems may mitigate liquid level drop. As described below, these multi-chamber systems may have different pumping configurations and arrangements, such as (i) a thermally connected pump-down chamber as illustrated in FIGS. 4 through 6, (ii) a hydraulically connected displacing chamber as illustrated in FIGS. 7 through 9 or (iii) a chamber with a cryogenic pump as illustrated in FIGS. 10 through 12. It should be noted that FIGS. 4-12 are simplified block diagrams that illustrate the multi-chamber systems.

FIGS. 4 through 6 show an axial cross-sectional view of a multi-chamber system 80, which may be used as the cryogen vessel for an MRI magnet system. In particular, the multi-chamber system 80 includes two separate chambers, namely a first chamber 82 and a second chamber 84, each of which defines a separate vessel or vessel chamber. The first chamber 82 includes one or more coils 86, which are superconducting coils immersed in a liquid helium 88 within the first chamber 82. It should be noted that the coils 86 may be configured and provided in any suitable manner that allows for MR imaging.

As illustrated in FIG. 4, the first chamber 82 initially may not be completely filled with helium 88 and includes a region 90 (e.g., void) containing no liquid helium 88. The amount of helium 88 in the first chamber 82 may be varied and the first chamber 82 may be completely filled in some embodiments.

The multi-chamber system 80 also includes a pump 92 connected to the second chamber 84. The pump 92 is configured to pump cryogen into and/or out of the second chamber 84.

FIGS. 4 through 6 of the multi-chamber system 80 illustrate a process for reducing pressure in a cryogen vessel in accordance with various embodiments using a thermally connected pump-down chamber. The process generally includes the following:

1. Prior to pump-down by the pump 92, both chambers 82 and 84 are filled with a liquid cryogen (e.g., liquid helium) at a temperature (T)=4.2 K and pressure (p) about 100 kiloPascals (kPa), as illustrated in FIG. 4.

2. A pump-down is performed on the second chamber 84 to $p_2$ about 5 kPa, $T_2$ about 1.8K as illustrated in FIG. 5, wherein the temperature ($T_2$) of the second chamber 84 is about the same as the temperature ($T_1$) of the first chamber 82 due to conductive barrier (the wall) between the chambers 82 and 84. The pump-down and subsequent decrease in temperature changes the state of the liquid helium from He I to He II. The magnet is ramped with the coils 86 in He II at 1.8K (subcooled at $p_1$ about 100 kPa). As illustrated in FIG. 5, the volume of helium 88 in the second chamber 84 has been reduced by pumping out helium with the pump 92.

3. With the magnet in persist mode, as illustrated in FIG. 6, the temperature of the helium 88 slowly rises due to heat leak into the cryostat formed by the multi-chamber system 80, as follows: p2→about 130 kPa and the temperature in the two chambers 82 and 84 are about equal ($T_1 \approx T_2 \to 4.5K$). Accordingly, an equilibrium state is restored with the cryocooler running, for example, the coldhead 46 (shown in FIG. 2) running. It should be noted that liquid helium 88 in the second chamber 84 may be maintained at the lower volume level or may be refilled.

Thus, two thermally connected chambers 82 and 84 are provided such that a pump-down is performed on the smaller chamber, namely the second chamber 84. In various embodiments, the pressure in the second chamber 84 is reduced to a pressure level significantly less than the first chamber 82 (e.g., 5 kPa versus 100 kPa). The coils 86 of the magnet in the first chamber 82 are in subcooled He II near ambient temperature. It should be noted that although the level or volume of helium 88 is restored, some helium vapor may be lost during the pump-down.

FIGS. 7 through 9 show an axial cross-sectional view of a multi-chamber system 100, which may be used as the cryogen vessel for an MRI magnet system. In particular, the multi-chamber system 100 includes two separate chambers, namely a first chamber 102 and a second chamber 104, each of which defines a separate vessel or vessel chamber. The first and second chambers 102 and 104 may be separated by a gap 106. The first chamber 102 includes one or more coils 108, which are superconducting coils immersed in a liquid helium 110 within the first chamber 102. It should be noted that the coils 108 may be configured and provided in any suitable manner that allows for MR imaging.

As illustrated in FIG. 7, the first chamber 102 initially may not be completely filled with helium 110 and includes a region 112 (e.g., void) containing no liquid helium. The amount of helium in the first chamber 102 may be varied and the first chamber 102 may be completely filled in some embodiments.

The multi-chamber system 100 also includes a pump 114 connected to the second chamber 104. The pump 114 is configured to pump cryogen into and/or out of the second chamber 104. Additionally a valve 116 is provided between the first and second chambers 102 and 104, which may communicatively couple the first and second chambers 102 and 104 to allow or prevent flow therebetween.

FIGS. 7 through 9 of the multi-chamber system 100 illustrate a process for reducing pressure in a cryogen vessel in accordance with various embodiments using a hydraulically connected displacing chamber. The process generally includes the following:

1. Prior to pump-down by the pump 114, both chambers 102 and 104 are filled with a liquid cryogen (e.g., a liquid helium) at T=4.2 K and p is about 100 kPa, as illustrated in FIG. 7. It should be noted that the valve 116 is open.

2. A pump-down is performed on both chambers 102 and 104 to $p_1=p_2$ of about 5 kPa and $T_1=T_2$ of about 1.8K as illustrated in FIG. 8. The magnet is ramped with the coils 108 in He II with T at about 1.8K and p at about 5 kPa.

3. Pressure is then applied (e.g., hydraulically applied) to the second chamber 104 to expel helium 110 and restore the level of helium 110 in the first chamber 102, for example, by opening the valve 116. The pressure is illustrated by the arrows in FIG. 9. Thereafter, the magnet is ramped with coils 108 in He II at T of about 1.8K and p at about 5 kPa.

With the magnet in persist mode (not shown), the temperature of and pressure on the helium 110 slowly rises due to heat leak into cryostat formed by the multi-chamber system 100, as follows: to p→about 130 kPa and T→4.5K. Accordingly, an equilibrium state is restored with the cryocooler running, for example, the coldhead 46 (shown in FIG. 2) running.

Thus, hydraulically chamber arrangement in provided such that a cryogen level in each decreases concurrently. After the pump-down is performed, pressure is elevated in the second chamber 104, which expels the remaining helium 110 and thus restores the level or volume of helium 110 in the first chamber 102. It should be noted that although the level or volume of helium 110 is restored, some helium vapor may be lost during the pump-down. Thus, pressure is reduced by pumping from one chamber such that the other chamber is sub-cooled without reducing the level of helium 110.

FIGS. 10 through 12 show an axial cross-sectional view of a multi-chamber system 120, which may be used as the cryogen vessel for an MRI magnet system. In particular, the multi-chamber system 120 includes two separate chambers, namely a first chamber 122 and a second chamber 124, each of which defines a separate vessel or vessel chamber. The first and second chambers 122 and 124 may be separated by a gap 126. The first chamber 122 includes one or more coils 128, which are superconducting coils immersed in a liquid helium 130 within the first chamber 122. It should be noted that the coils 128 may be configured and provided in any suitable manner that allows for MR imaging.

As illustrated in FIG. 10, the first chamber 122 initially may not be completely filled with helium 130 and includes a region 132 (e.g., void) containing no liquid helium. The amount of helium in the first chamber 122 may be varied and the first chamber 122 may be completely filled in some embodiments.

The multi-chamber system 120 also includes a pump 134 having a valve 136 connected between the first and second chambers 122 and 124. The pump 134 is configured to pump cryogen from the first chamber 122 to the second chamber 124. Additionally, a valve 138 is provided between the first and second chambers 122 and 124, which may communicatively couple the first and second chambers 122 and 124 to allow or prevent flow therebetween.

FIGS. 10 through 12 of the multi-chamber system 120 illustrate a process for reducing pressure in a cryogen vessel in accordance with various embodiments using a chamber with a cryogenic pump. The process generally includes the following:

1. Prior to pump-down by the pump 134, the second chamber 124 is empty and the first chamber 122 is filled with a liquid cryogen (e.g., a liquid helium) at T=4.2 K and p is about 100 kPa, as illustrated in FIG. 10. It should be noted that the valves 136 and 138 are closed.

2. The pump 134 (with the valve 136 open) pumps liquid helium 130 from the first chamber 122 to the second chamber 124 as illustrated in FIG. 11. The first chamber 122 is at $p_1$ of about 5 kPa and $T_1$ at about 1.8K; and the second chamber 124 is at $p_2$ of about 100 kPa and $T_2$ at about 4.2 K. It should be noted that additional pumping on the first chamber 122 may be performed. The magnet is ramped with the coils 128 in He II at 1.8K.

3. With the magnet in persist mode as illustrated in FIG. 12, the temperature slowly rises due to heat leak into cryostat formed by the multi-chamber system 120, as follow: $p2 \rightarrow$ about 130 kPa and $T_1 \approx T_2 \rightarrow 4.5K$. Accordingly, an equilibrium is restored with the cryocooler running, for example, the coldhead 46 (shown in FIG. 2) running. Helium 110 may be displaced from the second chamber 124 to the first chamber 124 to raise the volume or level of the helium 130 in the first chamber 122 by opening the valve 138.

Thus, a closed helium arrangement is provided. The multi-chamber system 120 uses internal refrigeration, illustrated by the liquid helium pump 134, which may be a Barber-Nichols pump and may include a Joule-Thomson (JT) valve, illustrated as the valve 138. In the one embodiment, liquid helium 130 is continuously pumped from the first chamber 122 into the second chamber 124. Some of the helium 130 may be transferred back to the first chamber 122 to be refrigerated again.

It should be noted that a space filler (not shown) also may be used to reduce the volume of the cryogen vessel to allow a faster pump-down before the ramping.

Thus, in accordance with various embodiments, the pressure in the cryogen vessel of an MRI system is reduced during magnet system ramping, which reduces the temperature. After ramping, when the magnet system is operating in a normal or persistent mode, the cryogen vessel is returned to ambient or about ambient pressure. Various embodiments, thus, may provide, for example, a helium I/helium II (He I/He II) magnet system.

Figure 13:
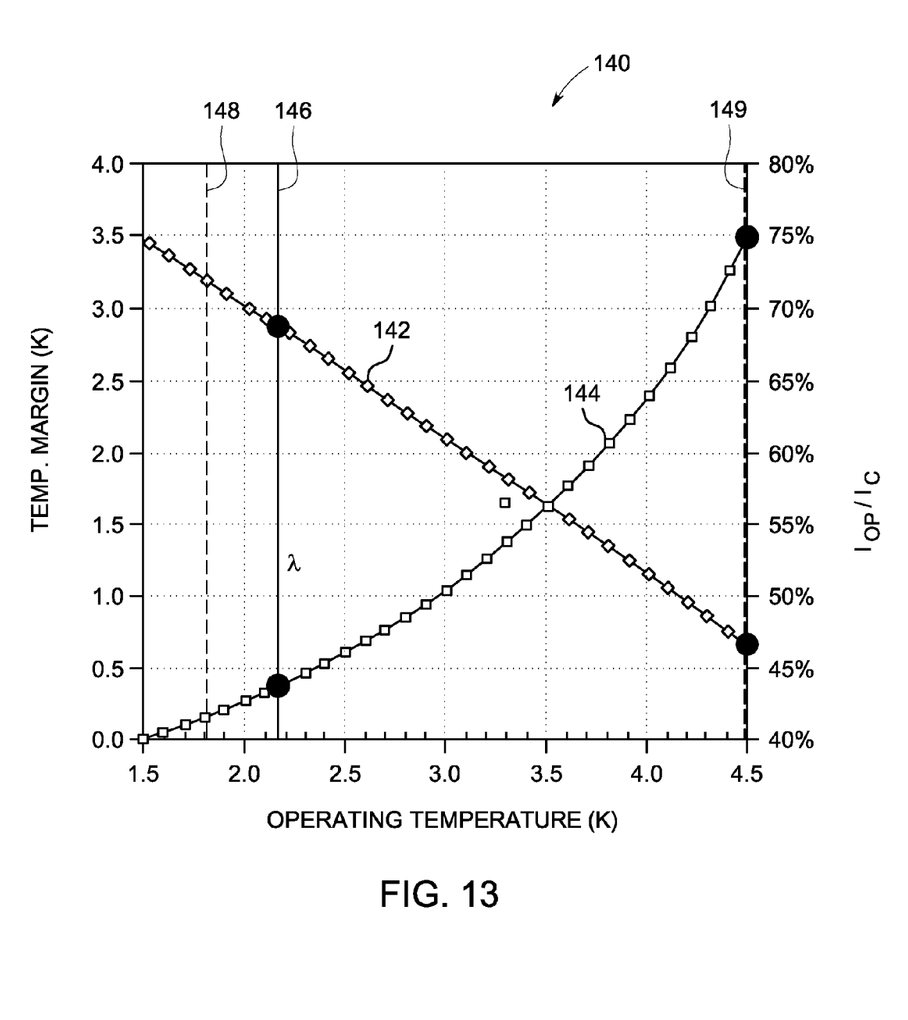
FIG. 13 is a graph illustrating temperature margin versus operating temperature for a superconducting magnet system.

A graph 140 of temperature margin (represented by the vertical axis) and operating temperature (represented by the horizontal axis) for a superconducting magnet system is shown in FIG. 13. In the graph 140, the plot 142 represents the temperature margin and the plot 144 represents the operating temperature, wherein the line 146 corresponds to the lambda point, the line 148 corresponds to a ramp state and the line 149 corresponds to a normal operating state. The graph 140 illustrates that:

1. The conductor has an operating current/critical current $(I_{op}/I_c) = 80\%$ at 4.49 K (p=4 psi), which is a drift-driven limit (n=45 assumed).
2. As the operating temperature $(T_{op})$ is lowered, Ic and $\Delta T_{marg}$ increase for this conductor.
3. $\Delta T_{marg}$ changes from 0.7K to 3.2K; $I_{op}/I_c$ from 75% to 42%.
4. At $T_{op}=4.2K$, a margin of 3.2K cannot be attained (even at zero current).

It should be noted that although some embodiments may be described in connection with superconducting magnets for MRI systems, the various embodiments may be implemented in connection with any type of system having superconducting magnets. The superconducting magnets may be implemented in other types of medical imaging devices, as well as non-medical imaging devices.

Thus, the various embodiments may be implemented in connection with different types of superconducting magnets, such as superconducting magnets for an MRI system. For example, the various embodiments may be implemented with superconducting magnets for use with the MRI system 150 shown in FIG. 13. It should be appreciated that although the system 150 is illustrated as a single modality imaging system, the various embodiments may be implemented in or with multi-modality imaging systems. The system 150 is illustrated as an MRI imaging system and may be combined with different types of medical imaging systems, such as a computed tomography (CT), positron emission tomography (PET), a single photon emission computed tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Figure 14:
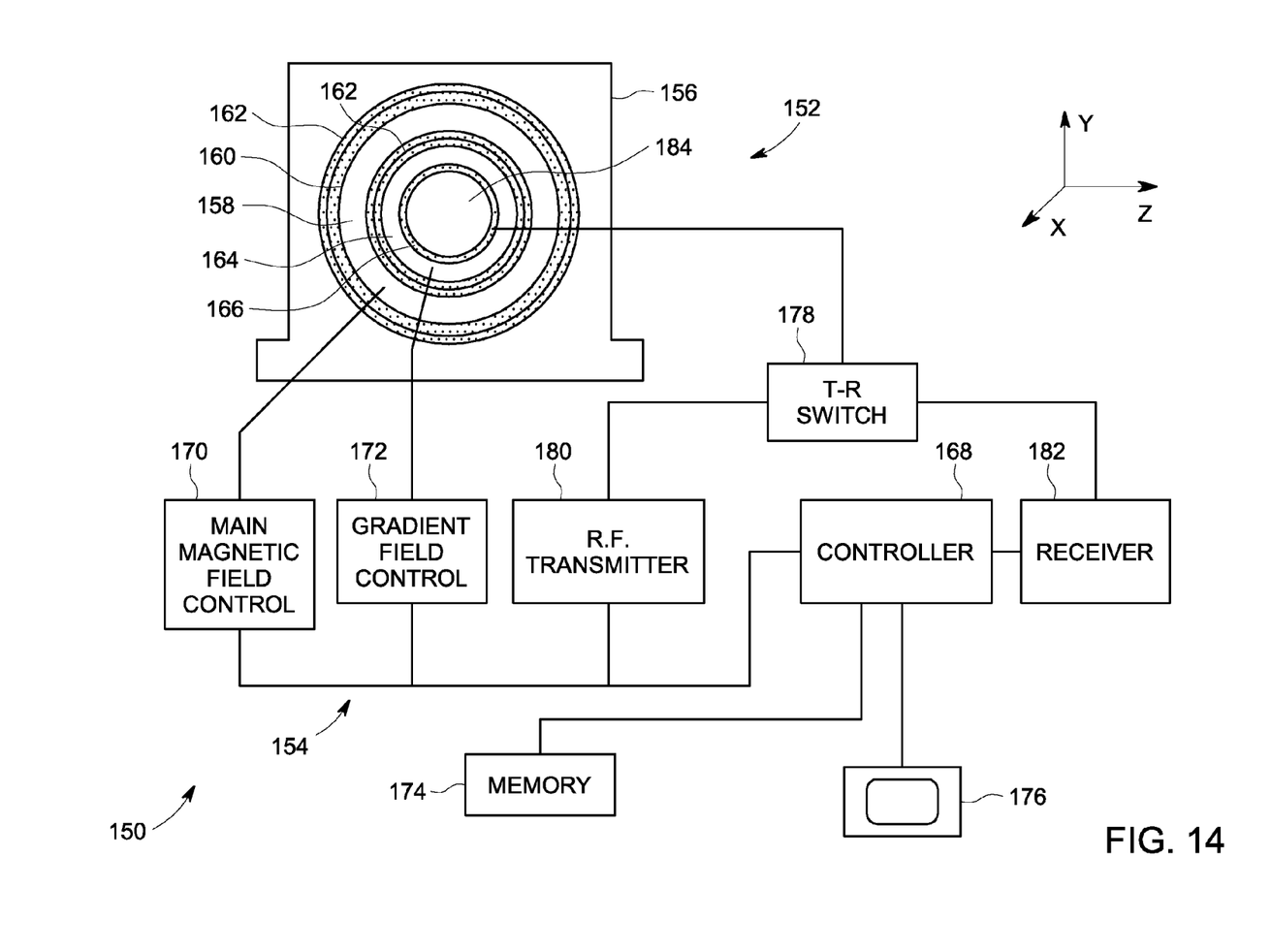
FIG. 14 is a pictorial view of an MRI system in which a multi-chamber system formed in accordance with various embodiments may be implemented.

Referring to FIG. 14, the MRI system 150 generally includes an imaging portion 152 and a processing portion 154 that may include a processor or other computing or controller device. The MRI system 150 includes within a gantry 156 a superconducting magnet 158 formed from coils or windings, which may be supported on a magnet coil support structure. A helium vessel 160 (also referred to as a cryostat), which may be configured similar to the helium vessel 42 (shown in FIG. 2) surrounds the superconducting magnet 158 (similar to the superconducting coils 52 (shown in FIG. 2)) and is filled with liquid helium. The liquid helium is used to cool the superconducting magnet 158 and the temperature of which may be reduced during ramping as described in more detail herein.

Thermal insulation 162 is provided surrounding the outer surface of the helium vessel 160 and the inner surface of the superconducting magnet 158. A plurality of magnetic gradient coils 164 are provided inside the superconducting magnet 158 and an RF transmit coil 166 is provided within the plurality of magnetic gradient coils 164. In some embodiments, the RF transmit coil 166 may be replaced with a transmit and receive coil. The components within the gantry 156 generally form the imaging portion 152. It should be noted that although the superconducting magnet 158 is a cylindrical shape, other shapes of magnets can be used.

The processing portion 154 generally includes a controller 168, a main magnetic field control 170, a gradient field control 172, a memory 174, a display device 176, a transmit-receive (T-R) switch 178, an RF transmitter 180 and a receiver 182.

In operation, a body of an object, such as a patient or a phantom to be imaged, is placed in the bore 184 on a suitable support, for example, a patient table. The superconducting magnet 158 produces a uniform and static main magnetic field $B_o$ across the bore 184. The strength of the electromagnetic field in the bore 184 and correspondingly in the patient, is controlled by the controller 168 via the main magnetic field control 170, which also controls a supply of energizing current to the superconducting magnet 158.

The magnetic gradient coils 164, which include one or more gradient coil elements, are provided so that a magnetic gradient can be imposed on the magnetic field $B_o$ in the bore 184 within the superconducting magnet 158 in any one or more of three orthogonal directions x, y, and z. The magnetic gradient coils 164 are energized by the gradient field control 172 and are also controlled by the controller 168.

The RF transmit coil 166, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. The receive surface coil may be an array of RF coils provided within the RF transmit coil 166.

The RF transmit coil 166 and the receive surface coil are selectably interconnected to one of the RF transmitter 180 or receiver 182, respectively, by the T-R switch 178. The RF transmitter 180 and T-R switch 178 are controlled by the controller 168 such that RF field pulses or signals are generated by the RF transmitter 180 and selectively applied to the patient for excitation of magnetic resonance in the patient. While the RF excitation pulses are being applied to the patient, the T-R switch 178 is also actuated to disconnect the receive surface coil from the receiver 182.

Following application of the RF pulses, the T-R switch 178 is again actuated to disconnect the RF transmit coil 166 from the RF transmitter 180 and to connect the receive surface coil to the receiver 182. The receive surface coil operates to detect or sense the MR signals resulting from the excited nuclei in the patient and communicates the MR signals to the receiver 182. These detected MR signals are in turn communicated to the controller 168. The controller 168 includes a processor (e.g., image reconstruction processor), for example, that controls the processing of the MR signals to produce signals representative of an image of the patient.

The processed signals representative of the image are also transmitted to the display device 176 to provide a visual display of the image. Specifically, the MR signals fill or form a k-space that is Fourier transformed to obtain a viewable image. The processed signals representative of the image are then transmitted to the display device 176.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A method for controlling a magnetic resonance imaging (MRI) magnet system, the method comprising:
   reducing pressure in a cryogen vessel of an MRI system to a pumped-down pressure level during magnet ramping; and
   increasing the pressure in the cryogen vessel from the pumped-down pressure level to a normal operating pressure level after magnet ramping is complete.

2. A method in accordance with claim 1 wherein reducing pressure comprises pumping gas out from the cryogen vessel using a vacuum pump.

3. A method in accordance with claim 1 wherein increasing pressure comprises adding gas to the cryogen vessel.

4. A method in accordance with claim 1 wherein reducing pressure comprises pumping gas out from the cryogen vessel until a temperature of cryogen in the cryogen vessel reaches a superfluid temperature.

5. A method in accordance with claim 1 wherein reducing pressure comprises pumping gas out from the cryogen vessel until a temperature of cryogen in the cryogen vessel reaches a temperature below a normal operating temperature.

6. A method in accordance with claim 1 wherein reducing pressure comprises pumping gas out from the cryogen vessel so the pressure reduces from about 100 kilo-Pascal (kPa) to about 5 kPa.

7. A method in accordance with claim 1 wherein the normal operating pressure level is about ambient pressure.

8. A method in accordance with claim 1 wherein reducing pressure comprises pumping gas out from the cryogen vessel prior to magnet ramping.

9. A method in accordance with claim 1 wherein the cryogen vessel comprises two chambers and reducing pressure comprises reducing pressure in one of the chambers to a pressure level significantly less than the other chamber.

10. A method in accordance with claim 9 wherein the reduced pressure is about 5 kilo-Pascal (kPa) and a pressure in the other chamber is about 100 kPa.

11. A method in accordance with claim 1 wherein the cryogen vessel comprises two chambers and reducing pressure comprises pumping cryogen liquid from one of the chambers such that the other chamber is sub-cooled without reducing a cryogen liquid level.

12. A method in accordance with claim 1 wherein the cryogen vessel comprises two chambers and reducing pressure comprises pumping out liquid cryogen from one chamber and thereafter pressurizing the other chamber to expel cryogen liquid to restore a cryogen liquid level in the one chamber.

13. A method in accordance with claim 1 wherein the cryogen vessel comprises two chambers and reducing pressure comprises pumping out liquid cryogen from a thermally connected pump-down chamber.

14. A method in accordance with claim 1 wherein the cryogen vessel comprises two chambers and reducing pressure comprises pumping out liquid cryogen from a hydraulically connected displacing chamber.

15. A method in accordance with claim 1 wherein the cryogen vessel comprises two chambers and reducing pressure comprises pumping out liquid cryogen from one chamber with a cryogenic pump.

16. A magnetic resonance imaging (MRI) magnet system comprising:
   a vessel having liquid cryogen therein; and
   a superconducting magnet within the vessel, wherein the vessel is configured to removably connect to a vacuum pump that is configured to pump cryogen from the vessel to reduce a pressure level within the vessel to a pumped-down pressure level during ramping of the superconducting magnet and increase the pressure level from the pumped-down pressure level to a normal operating pressure level during normal magnet operation after magnet ramping is complete.

17. An MRI magnet system in accordance with claim 16 wherein the vessel comprises a plurality of chambers and further comprising a controller configured to reduce the pressure level by pumping cryogen liquid from one of the chambers such that the other chamber is sub-cooled without reducing a cryogen liquid level.

18. An MRI magnet system in accordance with claim 16 wherein the vessel comprises a plurality of chambers and further comprising a controller configured to reduce the pressure level by pumping out liquid cryogen from one chamber and thereafter pressurizing the other chamber to expel cryogen liquid to restore a cryogen liquid level in the one chamber.

19. An MRI magnet system in accordance with claim 16 wherein the vessel comprises two chambers interconnected with a valve and wherein a pressure level in a smaller chamber of the two chambers is reduced significantly more than a larger chamber of the two chambers.

20. An MRI magnet system in accordance with claim 16 wherein the vessel comprises two chambers interconnected with the vacuum pump.

21. A kit for ramping a magnetic resonance imaging (MRI) magnet system, the kit comprising:
   a vacuum pump; and
   a connector configured to connect the vacuum pump to a vessel of the MRI magnet system to pump cryogen from the vessel to reduce a pressure level within the vessel to a pumped-down pressure level during ramping of a superconducting magnet of the MRI magnet system and return the pressure level from the pumped-down pressure level to a normal level after magnet ramping is complete.

* * * * *